United States Patent
Toshima et al.

(10) Patent No.: US 10,347,482 B2
(45) Date of Patent: Jul. 9, 2019

(54) SUBSTRATE PROCESSING APPARATUS, SUBSTRATE PROCESSING METHOD, AND STORAGE MEDIUM WITH PROGRAM STORED THEREIN FOR EXECUTING SUBSTRATE PROCESSING METHOD

(71) Applicant: Tokyo Electron Limited, Tokyo (JP)

(72) Inventors: Takayuki Toshima, Kumamoto (JP); Shoichi Terada, Kumamoto (JP); Junji Nakamura, Kumamoto (JP)

(73) Assignee: Tokyo Electron Limited, Dhahran (SA)

( * ) Notice: Subject to any disclaimer, the term of this patent is extended or adjusted under 35 U.S.C. 154(b) by 152 days.

(21) Appl. No.: 15/661,157

(22) Filed: Jul. 27, 2017

(65) Prior Publication Data

US 2018/0040468 A1 Feb. 8, 2018

(30) Foreign Application Priority Data

Aug. 5, 2016 (JP) .................................. 2016-154860

(51) Int. Cl.
 *B08B 3/10* (2006.01)
 *H01L 21/02* (2006.01)
 (Continued)

(52) U.S. Cl.
 CPC ............ *H01L 21/0206* (2013.01); *B08B 3/08* (2013.01); *B08B 3/10* (2013.01); *B08B 3/106* (2013.01); *H01L 21/02071* (2013.01); *H01L 21/31122* (2013.01); *H01L 21/6704* (2013.01); *H01L 21/67028* (2013.01); *H01L 21/67051* (2013.01);
 (Continued)

(58) Field of Classification Search
 CPC ........... H01L 21/0206; H01L 21/02071; H01L 21/31122; H01L 21/67028; H01L 21/6704; H01L 21/67051; H01L 21/21; H01L 21/67109; H01L 21/67253;
 (Continued)

(56) References Cited

U.S. PATENT DOCUMENTS

| 7,816,276 B2 * | 10/2010 | Otsuka | ............... H01L 21/6715 355/27 |
| 2004/0157419 A1 * | 8/2004 | Takei | ............... H01L 21/67109 438/553 |

(Continued)

FOREIGN PATENT DOCUMENTS

| JP | 2004-146594 A | 5/2004 |
| JP | 2010-114210 A | 5/2010 |
| JP | 2013-207080 A | 10/2013 |

*Primary Examiner* — Sharidan Carrillo
(74) *Attorney, Agent, or Firm* — Abelman, Frayne & Schwab

(57) ABSTRACT

The present disclosure relates to a processing liquid supplying unit configured to supply a processing liquid that contains a removing agent of an adhered substance and a solvent having a boiling point lower than a boiling point of the removing agent to a substrate, a substrate heating unit configured to subsequently heat the substrate at a predetermined temperature that is equal to or higher than the boiling point of the solvent in the processing liquid and is lower than the boiling point of the removing agent, and a rinsing liquid supplying unit configured to subsequently supply a rinsing liquid to the substrate so as to remove the adhered substance from the substrate.

8 Claims, 6 Drawing Sheets

(51) Int. Cl.
*B08B 3/08* (2006.01)
*H01L 21/67* (2006.01)
*H01L 21/311* (2006.01)
*H01L 21/3213* (2006.01)

(52) U.S. Cl.
CPC .. *H01L 21/67109* (2013.01); *H01L 21/67253* (2013.01); *H01L 21/31144* (2013.01); *H01L 21/32139* (2013.01)

(58) Field of Classification Search
CPC ......... H01L 21/31144; H01L 21/32139; B08B 3/08; B08B 3/10; B08B 3/106
See application file for complete search history.

(56) References Cited

U.S. PATENT DOCUMENTS

| | | | |
|---|---|---|---|
| 2011/0189847 A1* | 8/2011 | Tsai | G03F 7/20 438/595 |
| 2014/0038423 A1* | 2/2014 | Iwao | H01L 21/02104 438/758 |
| 2018/0040468 A1* | 2/2018 | Toshima | B08B 3/106 |

* cited by examiner

SUBSTRATE PROCESSING APPARATUS, SUBSTRATE PROCESSING METHOD, AND STORAGE MEDIUM WITH PROGRAM STORED THEREIN FOR EXECUTING SUBSTRATE PROCESSING METHOD

CROSS-REFERENCE TO RELATED APPLICATIONS

This application is based on and claims priority from Japanese Patent Application No. 2016-154860 filed on Aug. 5, 2016 with the Japan Patent Office, the disclosure of which is incorporated herein in its entirety by reference.

TECHNICAL FIELD

The present disclosure relates to a substrate processing apparatus and a substrate processing method for removing an adhered substance on a substrate (hereinafter, sometimes simply referred to as an "adhered substance") from the substrate, and a storage medium with a program stored therein for executing the substrate processing method.

BACKGROUND

In a semiconductor device manufacturing process, an etching target film (e.g., an interlayer insulating film or a metal film) formed on a substrate such as, for example, a semiconductor wafer is etched using a resist film as a mask material and a step of patterning the etching target film into a predetermined pattern is performed.

Meanwhile, attention has been recently paid to a Cu multilayer wiring technique using a low dielectric constant film (low-k film) as an interlayer insulating film, and in this Cu multilayer wiring technique, a dual Damascene method is adopted in which a buried wiring trench or hole is formed in the low-k film and Cu is buried therein. For the low-k film, an organic film is frequently used. When such an organic low-k film is etched, since a sufficient selection ratio with a resist film, which is the same organic film, cannot be obtained, an inorganic hard mask film such as, for example, a Ti film or a TiN film, is used as a mask material for etching. That is, the hard mask film is etched into a predetermined pattern using the resist film as a mask material, and the low-k film is etched using the hard mask film etched into the predetermined pattern, as a mask material.

It is required to remove an unnecessary adhered substance such as, for example, a resist film or a hard mask film remaining on the substrate after etching. The removal of the unnecessary adhered substance is performed, for example, while spreading the removal liquid over the entire surface of the semiconductor wafer by a centrifugal force by continuously supplying a removal liquid to the center of a semiconductor wafer while rotating the semiconductor wafer serving as a processing target substrate using a single wafer type cleaning apparatus (see, e.g., Japanese Patent Laid-open Publication Nos. 2004-146594, 2010-114210, and 2013-207080).

SUMMARY

The present disclosure relates to a substrate processing apparatus including: a removal processing unit configured to remove an adhered substance from a substrate; and a controller configured to control an operation of the removal processing unit. The removal processing unit includes: a processing liquid supplying unit configured to supply a processing liquid that contains a removing agent of the adhered substance and a solvent having a boiling point lower than a boiling point of the removing agent to the substrate; a substrate heating unit configured to heat the substrate at a predetermined temperature that is equal to or higher than the boiling point of the solvent and is lower than the boiling point of the removing agent; and a rinsing liquid supplying unit configured to supply a rinsing liquid to the substrate. The controller controls the processing liquid supplying unit, the substrate heating unit, and the rinsing liquid supplying unit in such a manner that the processing liquid supplying unit supplies the processing liquid to the substrate, the substrate heating unit subsequently heats the substrate at the predetermined temperature so as to promote evaporation of the solvent and reaction of the adhered substance with the removing agent, and the rinsing liquid supplying unit subsequently supplies the rinsing liquid to the substrate so as to remove the adhered substance from the substrate.

The foregoing summary is illustrative only and is not intended to be in any way limiting. In addition to the illustrative aspects, embodiments, and features described above, further aspects, embodiments, and features will become apparent by reference to the accompanying drawings and the following detailed description.

DETAILED DESCRIPTION

Figure 1:
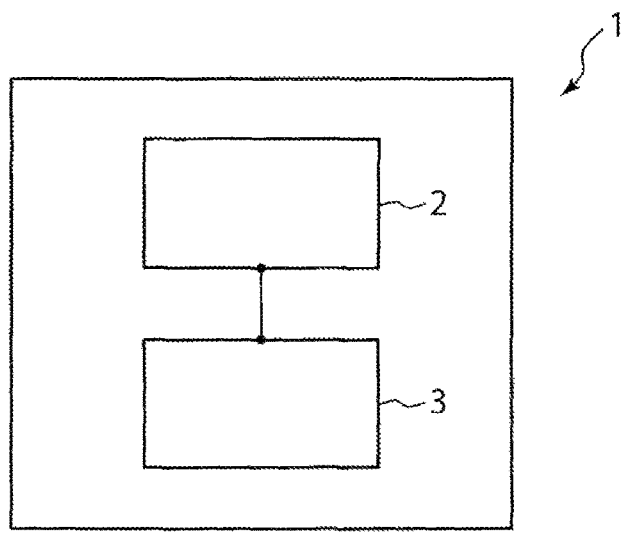
FIG. 1 is a schematic view illustrating the configuration of a substrate processing apparatus according to an exemplary embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

The present disclosure provides a substrate processing apparatus and a substrate processing method that is capable of effectively removing an adhered substance (e.g., a resist film or a hard coat film) from a substrate and a storage medium that stores a program for executing the substrate processing method.

According to an aspect of the present disclosure, there is provided a substrate processing apparatus including: a removal processing unit configured to remove an adhered substance from the substrate; and a controller configured to control an operation of the removal processing unit. The removal processing unit includes: a processing liquid supplying unit configured to supply a processing liquid that contains a removing agent of the adhered substance and a solvent having a boiling point lower than a boiling point of the removing agent to the substrate; a substrate heating unit configured to heat the substrate at a predetermined temperature that is equal to or higher than the boiling point of the solvent and is lower than the boiling point of the removing agent; and a rinsing liquid supplying unit configured to supply a rinsing liquid to the substrate. The controller controls the processing liquid supplying unit, the substrate heating unit, and the rinsing liquid supplying unit in such a manner that the processing liquid supplying unit supplies the processing liquid to the substrate, the substrate heating unit subsequently heats the substrate at the predetermined temperature so as to promote evaporation of the solvent and reaction of the adhered substance with the removing agent, and the rinsing liquid supplying unit subsequently supplies the rinsing liquid to the substrate so as to remove the adhered substance from the substrate.

In the above-described substrate processing apparatus, the processing liquid further contains a thickener.

In the above-described substrate processing apparatus, the thickener has a glass transition point that exceeds the boiling point of the solvent and is equal to or lower than the boiling point of the removing agent.

In the above-described substrate processing apparatus, the predetermined temperature is equal to or higher than the boiling point of the solvent and lower than the glass transition point of the thickener.

In the above-described substrate processing apparatus, the predetermined temperature is equal to or higher than the glass transition point of the thickener and is lower than the boiling point of the removing agent.

In the above-described substrate processing apparatus, the thickener has a glass transition point that is equal to or higher than the boiling point of the removing agent.

In the above-described substrate processing apparatus, the adhered substance is a hard mask film for etching.

In the above-described substrate processing apparatus, the controller controls the processing liquid supplying unit, the substrate heating unit, and the rinsing liquid supplying unit in such a manner that the processing liquid supplying unit supplies the processing liquid to the substrate so as to form a film of the processing liquid that covers the adhered substance, the substrate heating unit subsequently heats the substrate at the predetermined temperature while the adhered substance is covered by the film of the processing liquid so as to promote the evaporation of the solvent and the reaction of the adhered substance with the removing agent, and the rinsing liquid supplying unit subsequently supplies the rinsing liquid to the substrate so as to remove the adhered substance from the substrate.

A substrate processing method of the present disclosure is a substrate processing method for removing an adhered substance from the substrate. The substrate processing method includes: (A) supplying a processing liquid that contains a removing agent of the adhered substance and a solvent having a boiling point lower than a boiling point of the removing agent to the substrate; (B) after step (A), heating the substrate at a predetermined temperature that is equal to or higher than the boiling point of the solvent and is lower than the boiling point of the removing agent so as to promote evaporation of the solvent and reaction of the adhered substance with the removing agent; and (C) after step (B), supplying a rinsing liquid to the substrate so as to remove the adhered substance from the substrate.

In the above-described substrate processing method, the processing liquid further contains a thickener.

In the above-described substrate processing method, the thickener has a glass transition point that exceeds the boiling point of the solvent and is equal to or lower than the boiling point of the removing agent.

In the above-described substrate processing method, the predetermined temperature is equal to or higher than the boiling point of the solvent and is lower than the glass transition point of the thickener.

In the above-described substrate processing method, the predetermined temperature is equal to or higher than the glass transition point of the thickener and is lower than the boiling point of the removing agent.

In the above-described substrate processing method, the thickener has a glass transition point that is equal to or higher than the boiling point of the removing agent.

In the above-described substrate processing method, the adhered substance is a hard mask film for etching.

In the above-described substrate processing method, in step (A), a film of the processing liquid covering the adhered substance is formed on the substrate, and in step (B), the substrate is heated while the adhered substance is covered by the film of the processing liquid.

According to another aspect of the present disclosure, there is provided a non-transitory computer-readable storage medium storing a program that when executed, causes a computer to control the substrate processing apparatus so as to execute the substrate processing method.

According to the substrate processing apparatus and the substrate processing method of the present disclosure, the adhered substance on a substrate (e.g., a resist film or a hard coat film) may be effectively removed from the substrate.

Hereinafter, exemplary embodiments of the present disclosure will be described with reference to the accompanying drawings.

<Configuration of Substrate Processing Apparatus>

The configuration of a substrate processing apparatus according to an exemplary embodiment of the present disclosure will be described with reference to FIG. 1. FIG. 1 is a schematic view illustrating the configuration of the substrate processing apparatus according to the exemplary embodiment of the present disclosure.

As illustrated in FIG. 1, the substrate processing apparatus 1 according to the exemplary embodiment of the present disclosure includes a substrate processing unit 2 and a control unit 3 configured to control the operation of the substrate processing unit 2.

The substrate processing unit 2 performs various processings on the substrate. The various processings performed by the substrate processing unit 2 will be described below.

The control unit 3 is, for example, a computer, and includes a controller and a storage unit. The controller is, for example, a central processing unit (CPU) and controls the operation of the substrate processing unit 2 by reading and executing a program stored in the storage unit. The storage unit is configured by a storage device such as, for example, a random access memory (RAM), a read only memory (ROM), and a hard disk, and stores the program that controls various processings executed in the substrate processing unit 2. Meanwhile, the program may be recorded in a computer-readable storage medium, or may be installed from the storage medium to the storage unit. The computer-readable storage medium may be, for example, a hard disk (HD), a flexible disk (FD), a compact disk (CD), a magnet optical disk (MO), or a memory card. The storage medium may be recorded with a program that when executed by, for example, a computer for executing the operation of the substrate processing apparatus 1, causes the computer to control the substrate processing apparatus 1 so as to execute a substrate processing method (to be described below).

<Configuration of Substrate Processing Unit>

Figure 2:
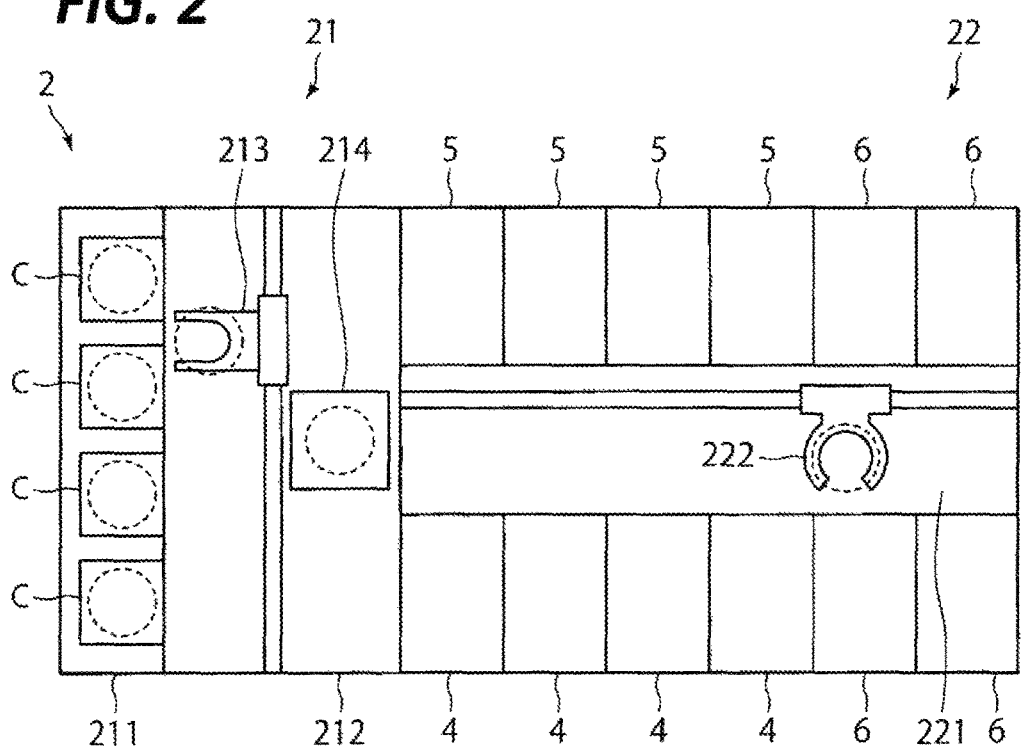
FIG. 2 is a schematic plan view illustrating the configuration of a substrate processing unit included in the substrate processing apparatus illustrated in FIG. 1.

Next, the configuration of the substrate processing unit 2 will be described with reference to FIG. 2. FIG. 2 is a schematic plan view illustrating the configuration of the substrate processing unit 2. Meanwhile, the broken lines in FIG. 2 represent substrates.

The substrate processing unit 2 performs various processings on a substrate. In this exemplary embodiment, the substrate processing unit 2 performs a removal processing of removing a hard mask film from the substrate after the dry etching processing. The processing performed by the substrate processing unit 2 is not particularly limited as long as the processing includes a processing of removing a hard mask film from a substrate. The substrate processing unit 2 may perform the processings other than the above-mentioned processing. In this exemplary embodiment, the hard mask film on a substrate after the dry etching is an object to be removed, but the hard mask film is an example of the adhered substance on a substrate. As the other specific examples of the adhered substance on a substrate, an unnecessary organic film, inorganic film, and organic-inorganic composite film (e.g., a resist film or an antireflection film) remaining on a substrate after dry etching, a by-product generated during the etching (a polymer derived from, e.g., an etching gas, a resist film, or a hard mask film), and a resist residue generated during the ashing of a resist film may be exemplified. Further, the adhered substance to be removed in the present disclosure may be, for example, a resist-cured layer after ion implantation, without being limited to the adhered substance on the substrate after the dry etching.

The substrate processing unit 2 includes a carry-in/out station 21 and a processing station 22 provided adjacent to the carry-in/out station 21.

The carry-in/out station 21 includes a placing unit 211 and a conveying unit 212 provided adjacent to the placing unit 211.

A plurality of conveying containers (hereinafter, referred to as "carriers C") configured to accommodate a plurality of substrates in a horizontal state are disposed on the placing unit 211.

The conveying unit 212 includes a conveying mechanism 213 and a delivering unit 214. The conveying mechanism 213 includes a holding mechanism that holds the substrate and is configured to be movable horizontally and vertically and to be rotatable about a vertical axis.

The processing station 22 includes first processing units 4 each configured to supply the processing liquid to the substrate, second processing units 5 each configured to heat the substrate supplied with the processing liquid by the first processing unit 4, and third processing units 6 each configured to supply the rinsing liquid to the substrate heated by the second processing unit 5. In this exemplary embodiment, the number of the first processing units 4 in the processing station 22 is two or more, but may be one. The same is applicable to the second processing unit 5 and the third processing unit 6. The first processing units 4 are arranged on one side of a conveying path 221 extending in a predetermined direction and the second processing units 5 are arranged on the other side of the conveying path 221. Further, the third processing units 6 are arranged on both sides of the conveying path 221. The arrangement of this exemplary embodiment is merely an example, and the arrangements of the first to third processing units may be arbitrarily determined depending on, for example, the design or the operational reason.

A conveying mechanism 222 is provided in the conveying path 221. The conveying mechanism 222 includes a holding mechanism that holds a substrate and is configured to be movable horizontally and vertically and to be rotatable about a vertical axis.

Hereinafter, a substrate before the processing liquid is supplied by the first processing unit 4 will be referred to as a "substrate W1," a substrate before the processing liquid is supplied by the first processing unit 4 and heated by the second processing unit 5 will be referred to as a "substrate W2," a substrate after being heated by the second processing unit 5 and before the rinsing liquid is supplied by the third processing unit 6 will be referred to as a "substrate W3," and a substrate after the rinsing liquid is supplied by the third processing unit 6 will be referred to as a "substrate W4."

In the substrate processing unit 2, the conveying unit 213 of the carry-in/out station 21 conveys substrates W1 and W2 between a carrier C and a delivering unit 214. Specifically, the conveying mechanism 213 takes out the substrate W1 from the carrier C disposed in the placing unit 211 and places the taken-out substrate W1 in the delivering unit 214. Further, the conveying mechanism 213 takes out the substrate W4 disposed in the delivering unit 214 by the conveying mechanism 222 of the processing station 22 to accommodate the taken-out substrate W4 in the carrier C of the placing unit 211.

In the substrate processing unit 2, the conveying mechanism 222 of the processing station 22 conveys the substrates W1 to W4 between the delivering unit 214 and a first processing unit 4, between the first processing unit 4 and a second processing unit 5, between the second processing unit 5 and a third processing unit 6, and between the third processing unit 6 and the delivering unit 214. Specifically, the conveying mechanism 222 takes out the substrate W1 disposed in the delivering unit 214 and carries the taken-out substrate W1 into the first processing unit 4. Further, the conveying mechanism 222 takes out the substrate W2 from the first processing unit 4 and carries the taken-out substrate W2 into the second processing unit 5. Further, the conveying mechanism 222 takes out the substrate W3 from the second processing unit 5 and carries the taken-out substrate W3 into the third processing unit 6. In addition, the conveying mechanism 222 takes out the substrate W4 from the third processing unit 6 and places the taken-out substrate W4 in the delivering unit 214.

<Configuration of First Processing Unit>

Figure 3:
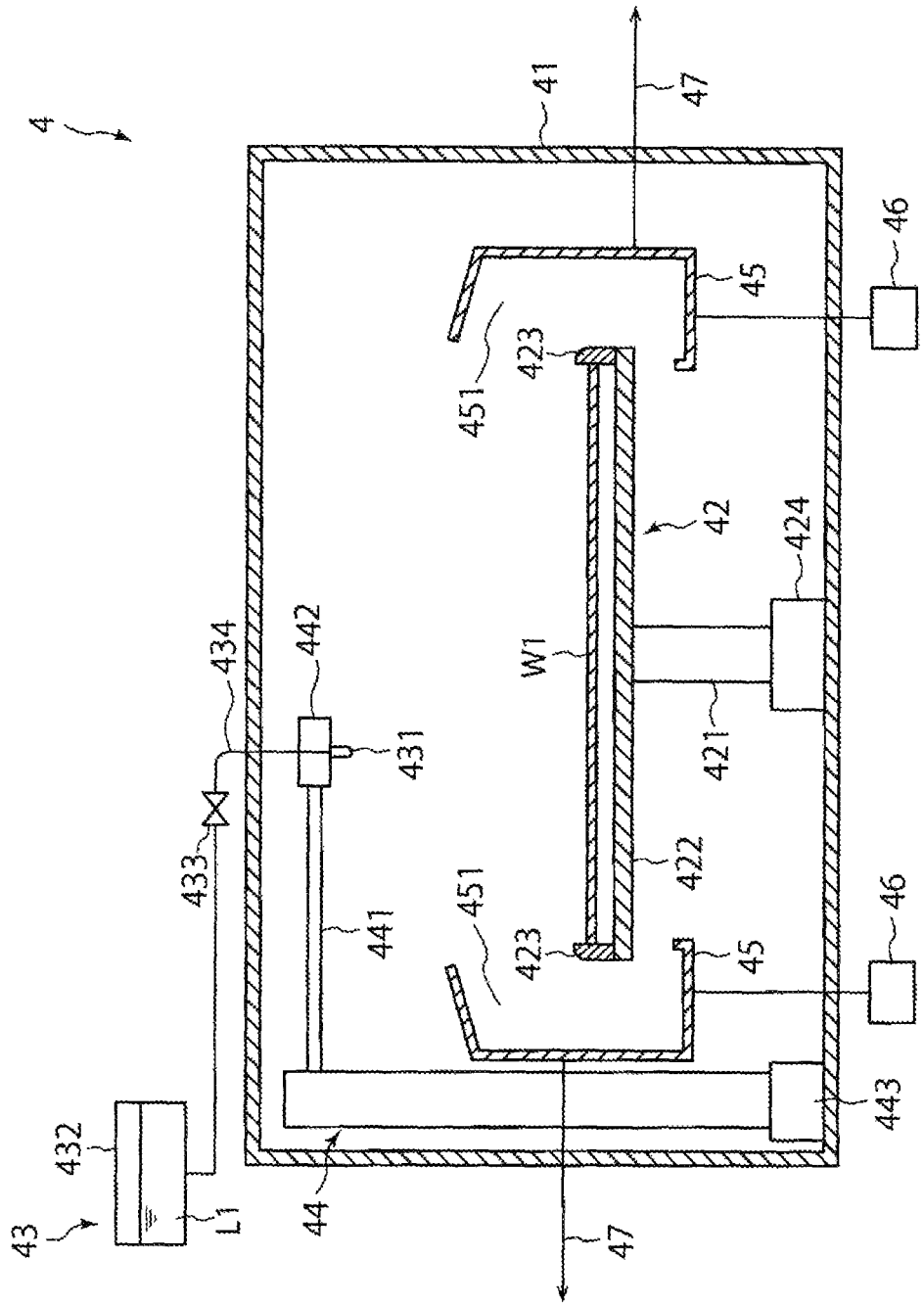
FIG. 3 is a schematic cross-sectional view illustrating the configuration of a first processing unit included in the substrate processing unit illustrated in FIG. 2.

Next, the configuration of the first processing unit 4 will be described with reference to FIG. 3. FIG. 3 is a schematic cross-sectional view illustrating the configuration of the first processing unit 4.

The first processing unit 4 performs processings including supplying of the processing liquid to the substrate W1. The processing performed by the first processing unit 4 may include the other processings.

In this exemplary embodiment, the substrate W1 is a substrate after the dry etching processing and has a concavo-convex pattern on the surface. An example of the structure of the substrate W1 is illustrated in FIG. 6D. As illustrated in FIG. 6D, the substrate W1 has, for example, a semiconductor wafer 91, an etching target film 92, and a hard mask film 93 in this order. The etching target film 92 and the hard mask film 93 are patterned into a predetermined pattern by the dry etching processing and form concavo-convex patterns on the surface of the substrate W1. The semiconductor wafer 91 is, for example, a silicon wafer. The etching target film 92 is, for example, an insulating film or a conductive film. The insulating film is, for example, a silicon-based insulating film such as, for example, a $SiO_2$ film, or a low dielectric constant film called a low-k film. The low-k film is a film having, for example, a specific dielectric constant lower than that of silicon dioxide, for example, a SiOC film or a SiCOH film. The conductive film is, for example, a metal film such as, for example, a Cu film or an Al film. The hard mask film 93 is, for example, an inorganic hard mask film, an organic hard mask film, or an organic-inorganic composite hard mask film.

Examples of the inorganic material constituting the inorganic hard mask film include, for example, titanium (Ti), titanium nitride (TiN), silicon oxide ($SiO_2$), silicon nitride ($Si_3N_4$), silicon oxynitride (SiON), silicon nitride (SiN), silicon carbide (SiC), or silicon carbide nitride (SiCN).

The organic material constituting the organic hard mask film includes, for example, amorphous carbon, a novolac resin, or a polyhydroxystyrene-based resin.

The organic-inorganic composite material constituting the organic-inorganic hard mask film includes, for example, polycarbosilane, organopolysilazane, organopolysilane, a copolymer of polysiloxane, or a metal oxide (titanium oxide, aluminum oxide, or tungsten oxide).

Figure 6A:
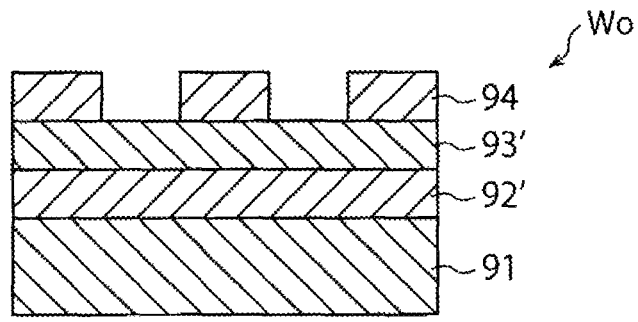
FIGS. 6A to 6D are schematic cross-sectional views for explaining a dry etching processing.

The substrate W1 is obtained, for example, by the dry etching processing of the raw substrate $W_0$ illustrated in FIG. 6A. The raw substrate $W_0$ has the semiconductor wafer 91, an etching target film 92', a hard mask film 93', and a photoresist film 94 patterned into a predetermined pattern by a photolithography process in this order. The etching target film 92' and the hard mask film 93' are not yet patterned into the predetermined pattern.

Figure 6B:
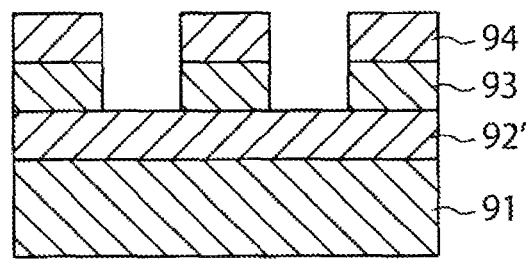

The dry etching processing of the raw substrate $W_0$ is performed as described below. First, as illustrated in FIG. 6B, the hard mask film 93' is dry etched using the photoresist film 94 as a mask material. As a result, the pattern of the photoresist film 94 is transferred to the hard mask film 93', and the hard mask film 93 patterned into the predetermined pattern is formed.

Figure 6C:
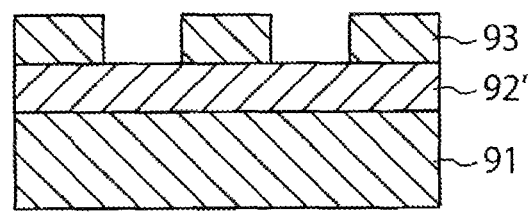
Figure 6D:
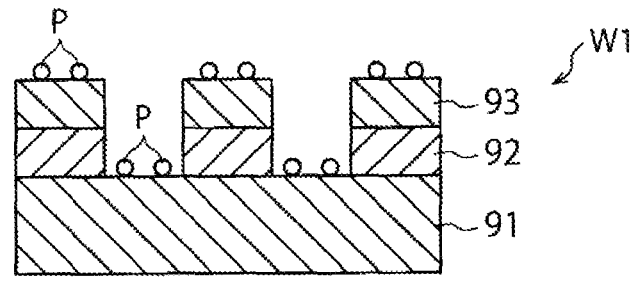

Subsequently, as illustrated in FIG. 6C, the photoresist film 94 is removed by performing an ashing processing.

Subsequently, as illustrated in FIG. 6D, the etching target film 92' is dry etched using the hard mask film 93 as a mask material. As a result, the etching target film 92 patterned into the predetermined pattern is formed.

The dry etching processing may be anisotropic etching or isotropic etching. As the etching method used in the dry etching processing, for example, an ECR etching method, an ICP etching method, a CCP etching method, a helicon etching method, a TCP etching method, a UHF plasma method, and an SWP etching method may be exemplified.

As illustrated in FIG. 6D, a by-product (a polymer derived from, e.g., an etching gas, a resist film, or a hard mask film) generated during the etching and a material P such as, for example, a resist residue generated during the ashing of the resist film may be adhered to the substrate W1.

The first processing unit 4 includes a chamber 41 and performs a substrate processing including supplying of the processing liquid within the chamber 41.

The first processing unit 4 includes a substrate holding unit 42. The substrate holding unit 42 includes a rotary shaft 421 extending in the vertical direction in the chamber 41, a turntable 422 attached to the upper end of the rotary shaft 421, a chuck 423 provided on the outer periphery of the upper surface of the turntable 422 and configured to support the outer edge of the substrate W1, and a driving unit 424 configured to rotationally drive the rotary shaft 421, and is rotatable while holding the substrate W1.

The substrate W1 is supported by the chuck 423 and held horizontally on the turntable 422 in a state of being slightly separated from the upper surface of the turntable 422. In this exemplary embodiment, a method of holding the substrate W1 by the substrate holding unit 42 is a so-called mechanical chuck type in which the outer edge of the substrate W1 is gripped by a movable chuck 423, but a so-called vacuum chuck type in which the back surface of the substrate W1 is vacuum-sucked may be used.

The base end portion of the rotary shaft 421 is rotatably supported by the driving unit 424, and the front end portion of the rotary shaft 421 horizontally supports the turntable 422. When the rotary shaft 421 rotates, the turntable 422 attached to the upper end portion of the rotary shaft 421 is rotated, whereby the substrate W1 held by the turntable 422 is rotated in a state of being supported by the chuck 423. The control unit 3 controls the operation of the driving unit 424 so as to control, for example, the rotation timing and the rotation speed of the substrate W1.

The first processing unit 4 includes a processing liquid supplying unit 43 that supplies a processing liquid L1 to the substrate W1 held by the substrate holding unit 42.

The processing liquid supplying unit 43 includes a nozzle 431 that ejects the processing liquid L1 to the substrate W1 held on the substrate holding unit 42 and a processing liquid source 432 that supplies the processing liquid L1 to the nozzle 431. The processing liquid L1 is stored in the tank of the processing liquid source 432. The processing liquid L1 is supplied from the processing liquid source 432 to the nozzle 431 through a supply pipe 434 in which a flow rate adjuster such as, for example, a valve 433 is interposed. The first processing unit 4 may include a plurality of processing liquid supplying units that supply different processing liquids, respectively. The additional processing liquid supplying units may be configured in the same manner as the processing liquid supplying unit 43.

The processing liquid L1 contains a removing agent of the hard mask film 93 (hereinafter, sometimes simply referred to as "removing agent") and a solvent having a boiling point lower than that of the removing agent. Meanwhile, in this exemplary embodiment, since the hard mask film 93 is an object to be removed, the removing agent of the hard mask film 93 will be described. However, regarding the removing agent of the hard mask film 93, the removing agent of the hard mask film 93 may be applied as a removing agent of the adhered substance on a substrate by replacing the removing agent with a removing agent of the adhered substance on the substrate such as, for example, a removing agent of an unnecessary organic film, inorganic film, and organic-inorganic composite film remaining on the substrate after the dry etching (e.g., a resist film or an antireflection film), a removing agent of a by-product generated during the etching (a polymer derived from, e.g., an etching gas, a resist film, or a hard mask film), a removing agent of a resist residue generated during the ashing of a resist film, and a removing agent of a resist-cured layer after ion implantation. Similarly, a description of the solvent contained in the processing liquid L1 may be applied to the solvent contained in the processing liquid for removing other adhered substance.

The removing agent may be appropriately selected from known removing agents depending on the type of a material of the adhered substance to be removed (the hard mask film 93 in this exemplary embodiment). In the field of photolithography, various removing agents are known for removing, for example, an unnecessary organic film, inorganic film, and organic-inorganic composite film remaining on the substrate after the dry etching (e.g., a resist film, an antireflection film, or a hard mask film), a by-product generated during the etching (a polymer derived from, e.g., an etching gas, a resist film, or a hard mask film), a resist residue generated during the ashing of a resist film, or a resist-cured layer after ion implantation (see, e.g., Japanese Patent Laid-open Publication Nos. Hei 07-028254, Hei 08-301911, Hei 10-239865, 2001-324823, 2004-103771, 2004-133153, 2004-177669, and 2016-27186, and International Publication Nos. WO 2007/020979 and WO 2009/27186). In the known removing agents, suitable objects to be removed are limited, but when using the known removing agents in the present disclosure, the objects to be removed in the present disclosure are not limited thereto. That is, when using the known removing agents in the present disclosure, objects to be removed which are the same as the known removing agents may be effectively (e.g., promptly) removed and objects to be removed which are different from the known removing agents may also be removed.

The working mechanisms of the removing agents are not particularly limited. The working mechanisms of the removing agents include, for example, the dissolution of the adhered substance to be removed (the hard mask film 93 in this exemplary embodiment), the reduction in the adhesive force of the adhered substance to be removed (the hard mask film 93 in this exemplary embodiment), lowering of the molecular weight of the adhered substance to be removed (the hard mask film 93 in this exemplary embodiment), and introduction into the adhered substance of a functional group having affinity for a rinsing liquid L2 (the hard mask film 93 in this exemplary embodiment). Therefore, the removing agents are concepts including, for example, a releasing agent and a dissolving agent.

When the hard mask film 93 is made of an inorganic material, for example, hydrogen peroxide may be exemplified as the removing agent.

When the hard mask film 93 is made of an organic material and/or an organic-inorganic composite material, for example, quaternary ammonium hydroxide, water-soluble amine, hydrogen peroxide, sulfuric acid, or hydrogen fluoride may be exemplified as the removing agent, and one of these removing agents may be used alone or two or more of these removing agents may be used in combination as long as the removal performance is exhibited. As the combinations of two or more types that can exhibit the removal performance, for example, a combination of a quaternary ammonium salt and water-soluble amine, a combination of hydrogen peroxide and sulfuric acid may be exemplified.

As the quaternary ammonium hydroxide, for example, tetramethylammonium hydroxide (TMAH) may be exemplified.

As the water-soluble amine, for example, alkanolamines such as monoethanolamine may be exemplified.

The solvent contained in the processing liquid L1 is not particularly limited as long as the solvent has a boiling point lower than that of the removing agent, and may be appropriately selected from known solvents.

When two or more types of removing agents are contained in the processing liquid L1, a solvent having a boiling point lower than that of the removing agent having the lowest boiling point among all removing agents contained in the processing liquid L1 is selected.

When two or more types of solvents are contained in the processing liquid L1, two or more types of solvents are selected so that the boiling point of a mixture of the solvent is lower than that of the removing agent.

As the solvent contained in the processing liquid L1, for example, water or a water-soluble organic solvent may be used. One of these solvents may be used alone or two or more types of these solvents may be used in combination.

As the water-soluble solvent, for example, sulfoxides such as dimethylsulfoxide may be exemplified.

As specific examples of the processing liquid L1, for example, a mixture of a quaternary ammonium salt and water, a mixture of a quaternary ammonium salt, a water-soluble organic solvent such as dimethylsulfoxide, and water, a mixture of quaternary ammonium hydroxide, a water-soluble organic solvent such as alkanolamine and dimethylsulfoxide, and water, may be exemplified.

Figure 7A:
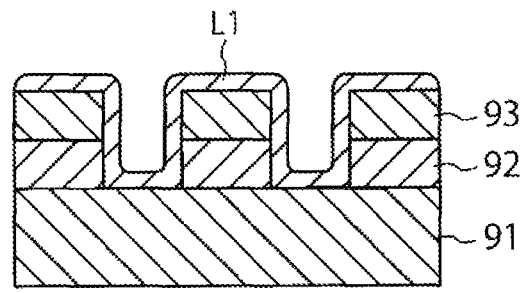
FIG. 7A is a schematic cross-sectional view for explaining the state of a thickener containing processing liquid when the processing liquid is supplied to a substrate.
Figure 7B:
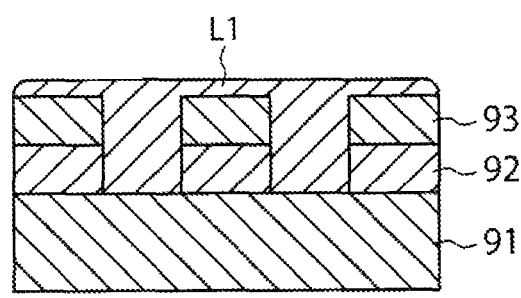
FIG. 7B is a schematic cross-sectional view for explaining the state of a thickener non-containing processing liquid when the processing liquid is supplied to the substrate.

The processing liquid L1 may contain a thickener. When the processing liquid L1 does not contain a thickener (when the viscosity of the processing liquid L1 is low), in order to form a film of the processing liquid L1 covering the hard mask film 93, it is required to use the processing liquid L1 in an amount sufficient to fill the concavo-convex pattern of the substrate W1, as illustrated in FIG. 7B. On the contrary, when the processing liquid L1 contains a thickener (when the viscosity of the processing liquid L1 is high), the hard mask film 93 may be covered by the film of the processing liquid L1 along the concavo-convex pattern of the substrate W1 (that is, conformal coating by the processing liquid L1 becomes possible), as illustrated in FIG. 7A. Therefore, when the processing liquid L1 contains a thickener, in order to form the film of the processing liquid L1 covering the hard mask film 93, the required amount of the processing liquid L1 may be reduced. Further, in the case where the processing liquid L1 contains a thickener, when the substrate W2 supplied with the processing liquid L1 is conveyed from the first processing unit 4 to the second processing unit 5, the processing liquid L1 hardly spills out of the substrate W2.

The thickener is not particularly limited as long as the thickener is capable of increasing the viscosity of the processing liquid L1, and may be appropriately selected from known thickeners. As the thickener, for example, methyl cellulose, carboxymethyl cellulose, polyethylene glycol, sodium polyacrylate, and polyvinyl alcohol may be exemplified. One of these thickeners may be used alone or two or more types of these thickeners may be used in combination.

In this exemplary embodiment, a thickener having a glass transition point which exceeds the boiling point of the solvent contained in the processing liquid L1 and is equal to or lower than the boiling point of the removing agent contained in the processing liquid L1 or is lower than the boiling point thereof is used. In this exemplary embodiment, when two or more types of removing agents are contained in the processing liquid L1, a thickener that has a glass transition point equal to or lower than the boiling point of the removing agent having the lowest boiling point among all removing agents contained in the processing liquid L1 is selected. Further, in this exemplary embodiment, when two or more types of solvents are contained in the processing liquid L1, a thickener having a glass transition point that exceeds the boiling point of the mixture of solvents is selected. However, a glass transition point of the thickener and a relationship between the solvent contained in the processing liquid L1 and the removing agent is not particularly limited to this exemplary embodiment. When the processing is further promoted by heating at a high temperature equal to or higher than the boiling point of the removing agent, the thickener may have a glass transition point equal to or higher than the boiling point of the removing agent contained in the processing liquid L1.

The first processing unit 4 includes a nozzle moving mechanism 44 that drives nozzles 431 and 431. The nozzle moving mechanism 44 includes an arm 441, a driving mechanism built-in type movable body 442 movable along the arm 441, and a rotating and elevating mechanism 443 that rotates and elevates the arm 441. The nozzle 431 is attached to the movable body 442. The nozzle moving mechanism 44 is capable of moving the nozzle 431 between the position above the center of the substrate W1 held by the substrate holding unit 42 and the position above the peripheral edge of the substrate W1, and is capable of moving the nozzle 431 to a standby position outside a cup 45 (to be described later) in a plan view.

The first processing unit 4 includes a cup 45 having a discharge port 451. The cup 45 is provided around the substrate holding unit 42 and receives various processing liquids (e.g., a cleaning liquid) splashed from the substrate W1. The cup 45 is provided with an elevating mechanism 46 configured to drive the cup 45 in the vertical direction and a liquid discharge mechanism 47 configured to collect and discharge various processing liquids splashed from the substrate W1 to the discharge port 451.

<Configuration of Second Processing Unit>

Figure 4:
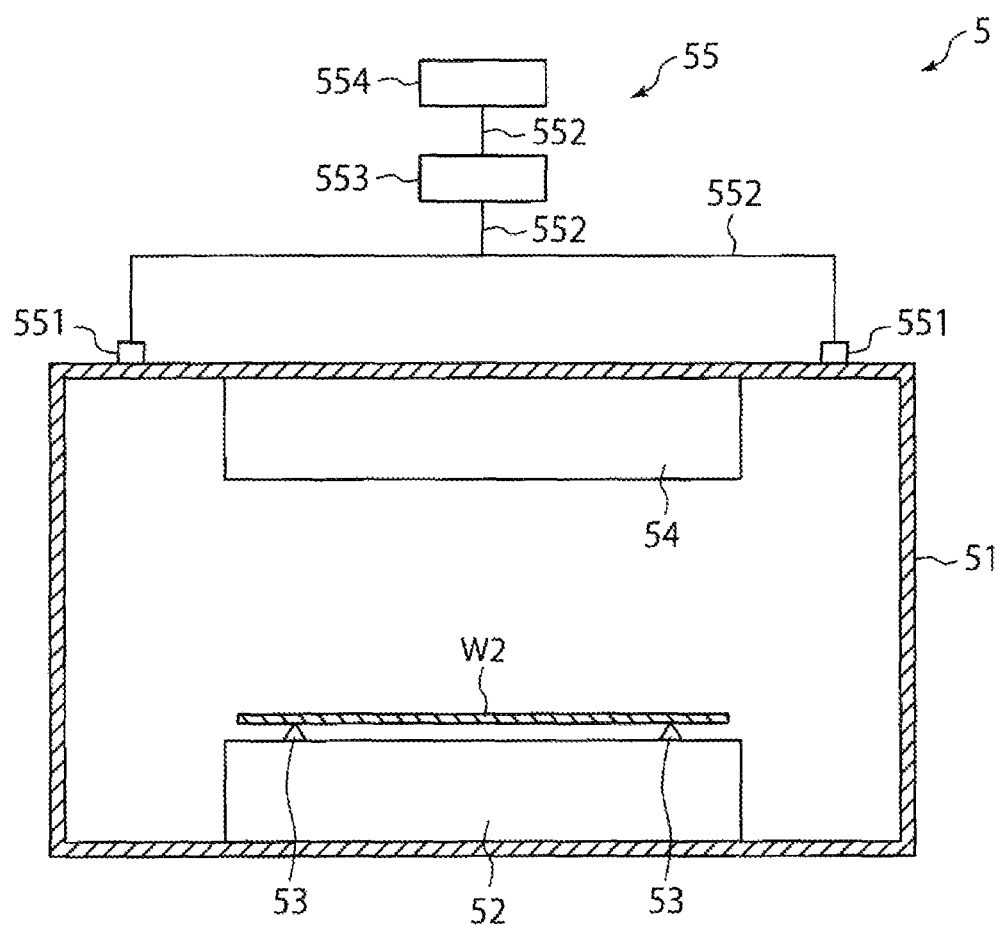
FIG. 4 is a schematic cross-sectional view illustrating the configuration of a second processing unit included in the substrate processing unit illustrated in FIG. 2.

Next, the configuration of the second processing unit 5 will be described with reference to FIG. 4. FIG. 4 is a schematic cross-sectional view illustrating the configuration of the second processing unit 5.

The second processing unit 5 performs processings including supplying of the processing liquid to the substrate W2. The processing performed by the second processing unit 5 may include the other processings.

The second processing unit 5 includes a chamber 51 and performs a substrate processing including heating of the substrate W2 within the chamber 51.

The second processing unit 5 includes a substrate placing unit 52 provided within the chamber 51. A heater such as, for example, a resistance heating unit and a lamp heater (e.g., an LED lamp heater) may be built in the substrate placing unit 52. A plurality of substrate holding members 53 protrude from the upper surface of the substrate placing unit 52. A small gap is formed between the lower surface of the substrate W2 and the upper surface of the substrate placing unit 52 by supporting the peripheral portion of the lower surface of the substrate W2 by the substrate holding member 53.

The second processing unit 5 includes a substrate heating unit 54 provided above the substrate placing unit 52 within the chamber 51. The substrate heating unit 54 includes a heater such as, for example, a resistance heating unit and a lamp heater (e.g., an LED lamp heater). The substrate heating unit 54 is, for example, a heat plate. The substrate heating unit 54 is capable of heating the substrate W2 held on the substrate placing unit 52 by the substrate holding member 53 at a predetermined temperature which is equal to or higher than the boiling point of the solvent in the processing liquid L1 and is lower than the boiling point of the removing agent. The initial temperature (temperature before heating) of the substrate W2 is, for example, room temperature. The substrate heating unit 54 is capable of performing heating at a set temperature and time. The substrate heating unit 54 is capable of heating the substrate W2 while changing the heating temperature in a stepwise manner or is capable of heating the substrate W2 while constantly maintaining the heating temperature. Further, the substrate heating unit 54 is capable of heating the substrate W2 for a time sufficient to promote evaporation of the solvent in the processing liquid L1 on the substrate W2 and reaction between the adhered substance on the substrate (the hard mask film 93 in this exemplary embodiment) and the removing agent.

The chamber 51 is provided with an exhaust unit 55 that exhausts the atmosphere in the chamber 51. The exhaust unit 55 includes one or more exhaust ports 551 formed in the upper portion of the chamber 51, a cold trap 553 connected to the exhaust ports 551 via an exhaust duct (exhaust line) 552, and a vacuum pump 554 connected to the cold trap 553. The atmosphere in the chamber 51 is discharged from the chamber 51 via the exhaust port 551 and the exhaust duct 552 sucked by the vacuum pump 554, whereby the solvent evaporated from the substrate W2 is also discharged from the chamber 51, and re-adhesion of the evaporated solvent to the substrate W2 is suppressed.

<Configuration of Third Processing Unit>

Figure 5:
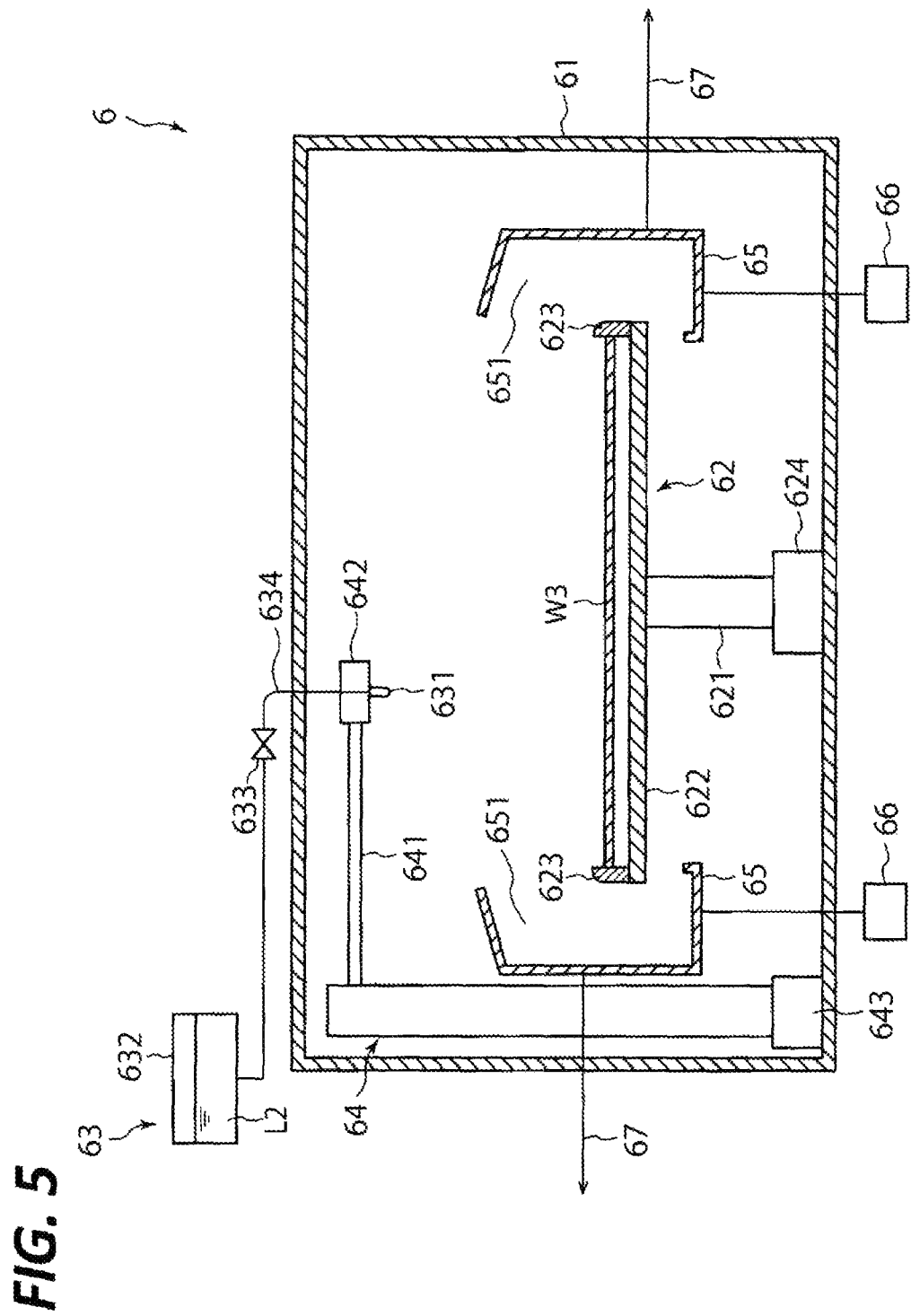
FIG. 5 is a schematic cross-sectional view illustrating the configuration of a third processing unit included in the substrate processing unit illustrated in FIG. 2.

Next, the configuration of the third processing unit 6 will be described with reference to FIG. 5. FIG. 5 is a schematic cross-sectional view illustrating the configuration of the third processing unit 6.

The third processing unit 6 performs processings including supplying of the rinsing liquid to the substrate W3 that is heated after the processing liquid L1 is supplied. The processing performed by the third processing unit 6 may include the other processings.

The third processing unit 6 includes a chamber 61 and performs a substrate processing including supplying of the rinsing liquid within the chamber 61.

The third processing unit 6 includes a substrate holding unit 62. The substrate holding unit 62 includes a rotary shaft 621 extending in the vertical direction in the chamber 61, a turntable 622 attached to the upper end of the rotary shaft 621, a chuck 623 provided on the outer periphery of the upper surface of the turntable 622 and configured to support the outer edge of the substrate W3, and a driving unit 624 configured to rotationally drive the rotary shaft 621, and is rotatable holding the substrate W3.

The substrate W3 is supported by the chuck 623 and held horizontally on the turntable 622 in a state of being slightly separated from the upper surface of the turntable 622. In this exemplary embodiment, a method of holding the substrate W3 by the substrate holding unit 62 is a so-called mechanical chuck type in which the outer edge of the substrate W3 is gripped by a movable chuck 623, but a so-called vacuum chuck type in which the back surface of the substrate W3 is vacuum-sucked may be used.

The base end portion of the rotary shaft 621 is rotatably supported by the driving unit 624, and the front end portion of the rotary shaft 621 horizontally supports the turntable 622. When the rotary shaft 621 rotates, the turntable 622 attached to the upper end portion of the rotary shaft 621 is rotated, whereby the substrate W3 held by the turntable 622 is rotated in a state of being supported by the chuck 623. The control unit 3 controls the operation of the driving unit 624 so as to control, for example, the rotation timing and the rotation speed of the substrate W3.

The third processing unit 6 includes a rinsing liquid supplying unit 63 that supplies a rinsing liquid L2 to the substrate W3 held by the substrate holding unit 62.

The rinsing liquid supplying unit 63 includes a nozzle 631 that ejects the rinsing liquid L2 to the substrate W3 held by the substrate holding unit 62 and a rinsing liquid source 632 that supplies the rinsing liquid L2 to the nozzle 631. The rinsing liquid L2 is stored in the tank of the rinsing liquid source 632. The rinsing liquid L2 is supplied from the rinsing liquid source 632 to the nozzle 631 through a supply pipe 634 in which a flow rate adjuster such as, for example, a valve 633 is interposed. The third processing unit 6 may include a plurality of rinsing liquid supplying units that supply different rinsing liquids, respectively. The additional rinsing liquid supplying units may be configured in the same manner as the rinsing liquid supplying unit 63.

The rinsing liquid L2 may be selected from the liquids that are capable of removing a substance remaining on the substrate W3 from the substrate W3. The substances remaining on the substrate W3 are, for example, a removing agent, an adhered substance that has reacted with the removing agent, and a residue of the processing liquid L1 (e.g., a thickener when the processing liquid L1 contains the thickener). Meanwhile, the thickener after heating may be, for example, a decomposed product or a denatured product of the thickener. Further, the adhered substance that has reacted with the removing agent (the hard mask film 93 in this exemplary embodiment) may be, for example, a dissolved product, a decomposed product, a denatured product of the adhered substance. As the rinsing liquid L2, for example, water, isopropyl alcohol (IPA), or N-methylpyrrolidone (NMP) may be used. When the thickener is, for example, methyl cellulose, carboxymethyl cellulose, or polyvinyl alcohol, the rinsing liquid may be water. When the thickener is, for example, polyethylene glycol or sodium polyacrylate, the rinsing liquid may be NMP. The rinsing liquid L2 supplied to the substrate W3 may be heated at room temperature or at a temperature higher than room temperature. By heating the rinsing liquid L2 at a temperature higher than room temperature and supplying the rinsing liquid L2, the rinse efficiency by the rinsing liquid L2 may be increased.

Meanwhile, the description regarding the rinsing liquid may be applied to the case where an object to be removed is an adhered substance other than the hard mask film 93, for example, the case where the object to be removed is, for example, an unnecessary organic film, an inorganic film, or an organic-inorganic composite film remaining on the substrate after dry etching (e.g., a resist film or an antireflection film), a by-product generated during etching (a polymer derived from, e.g., an etching gas, a resist film, or a hard mask film), a resist residue generated during the ashing of a resist film, or a resist-cured layer after ion implantation.

The third processing unit 6 includes a nozzle moving mechanism 64 that drives nozzles 631 and 631. The nozzle moving mechanism 64 includes an arm 641, a driving mechanism built-in type movable body 642 movable along the arm 641, and a rotating and elevating mechanism 643 that rotates and elevates the arm 641. The nozzle 631 is attached to the movable body 642. The nozzle moving mechanism 64 is capable of moving the nozzle 631 between the position above the center of the substrate W3 held by the substrate holding unit 62 and the position above the peripheral edge of the substrate W3, and is capable of moving the nozzle 431 to a standby position outside a cup 65 (to be described later) in a plan view.

The third processing unit 6 includes a cup 65 having a discharge port 651. The cup 65 is provided around the substrate holding unit 62 and receives various processing liquids (e.g., a rinsing liquid) splashed from the substrate W3. The cup 65 is provided with an elevating mechanism 66 configured to drive the cup 65 in the vertical direction and a liquid ejecting mechanism 67 configured to collect and discharge various processing liquids splashed from the substrate W3 to the discharge port 651.

The third processing unit 6 may include a nozzle that ejects a drying solvent such as, for example, isopropyl alcohol (IPA) to the substrate W3 held by the substrate holding unit 62 and a drying solvent supplying unit including a drying solvent source that supplies the drying solvent to the nozzle. Further, the third processing unit 6 may include a nozzle that ejects a drying gas such as, for example, nitrogen gas and dry gas to the substrate W3 held by the substrate holding unit 62 and a drying gas supplying unit for supplying a gas for drying that has a source of a gas for drying and supplies the gas for drying to the nozzle.

<Substrate Processing Method>

Hereinafter, the substrate processing method performed by the substrate processing apparatus 1 will be described. The substrate processing method performed by the substrate processing apparatus 1 is a method of removing the hard mask film from the substrate after the dry etching processing. In this exemplary embodiment, the hard mask film on the substrate after the dry etching is an object to be removed, but the hard mask film is an example of the adhered substance on the substrate. As the other specific examples of the adhered substance on the substrate, for example, an unnecessary organic film, inorganic film, and organic-inorganic composite film remaining on the substrate after the dry etching (e.g., a resist film or an antireflection film), a by-product generated during the etching (a polymer derived from, e.g., an etching gas, a resist film, or a hard mask film), a resist residue generated during the ashing of a resist film, and a resist-cured layer after ion implantation may be exemplified.

A substrate processing method performed by the substrate processing apparatus 1 includes: (A) supplying a processing liquid L1 that contains a removing agent of a hard mask film 93 and a solvent having a boiling point lower than the boiling point of the removing agent to the substrate W1; (B) after step (A), heating a substrate W2 at a predetermined temperature that is equal to or higher than the boiling point of the solvent in the processing liquid L1 and is lower than the boiling point of the removing agent so as to promote evaporation of the solvent in the processing liquid L1 on the substrate W2 and reaction of the hard mask film 93 with the removing agent; and (C) after step (B), supplying the rinsing liquid L2 to the substrate W3 so as to remove the hard mask film 93 from the substrate W3.

First, the substrate W1 after the dry etching processing is carried into the first processing unit 4. At this time, the conveying mechanism 213 takes out the substrate W1 from the carrier C disposed in the placing unit 211 and places the taken-out substrate W1 in the delivering unit 214. The conveying mechanism 222 takes out the substrate W1 disposed in the delivering unit 214 and carries the taken-out substrate W1 the substrate W1 into the first processing unit 4.

The substrate W1 carried into the first processing unit 4 is held by the substrate holding unit 42. At this time, the substrate holding unit 42 horizontally holds the substrate W1 on the turntable 422 in a state where the outer edge of the substrate W1 is supported by the chuck 423. The driving unit 424 rotates the substrate W1 held by the substrate holding unit 42 at a predetermined speed. The control unit 3 controls the operation of the driving unit 424 so as to control, for example, the rotation timing, and the rotation speed of the substrate W1.

Step (A) is performed on the substrate W1 held by the substrate holding unit 42. In step (A), while the substrate W1 held by the substrate holding unit 42 is rotated at a predetermined speed, the nozzle 431 of the processing liquid supplying unit 43 is positioned above the center of the substrate W1, and the processing liquid L1 is supplied from the nozzle 431 to the substrate W1. At this time, the control unit 3 controls the operation of the processing liquid supplying unit 43 so as to control, for example, the supplying timing, supplying time, and supplying amount of the processing liquid L1. The processing liquid L1 supplied to the substrate W1 spreads to the surface of the substrate W1 by the centrifugal force caused by the rotation of the substrate W1. As a result, the film of the processing liquid L1 covering the hard mask film 93 is formed on the substrate W1. The processing liquid L1 splashed from the substrate W1 is discharged via the discharge port 451 of the cup 45 and the liquid discharge mechanism 47.

When the processing liquid L1 does not contain a thickener, in order to form a film of the processing liquid L1 covering the hard mask film 93, it is required to use the processing liquid L1 in an amount sufficient to fill the concavo-convex pattern of the substrate W1, as illustrated in FIG. 7B. On the contrary, when the processing liquid L1 contains a thickener, the hard mask film 93 may be covered with the film of the processing liquid L1 along the concavo-convex pattern of the substrate W1 (that is, conformal coating by the processing liquid L1 becomes possible). Therefore, when the processing liquid L1 contains a thickener, in order to form the film of the processing liquid L1 covering the hard mask film 93, the required amount of the processing liquid L1 may be reduced.

The substrate W2 supplied with the processing liquid L1 in the first processing unit 4 is conveyed to the second processing unit 5. At this time, the conveying mechanism 222 takes out the substrate W2 from the first processing unit 4 and carries the taken-out substrate W2 into the second processing unit 5. In a case where the processing liquid L1 contains a thickener, when the substrate W2 supplied with the processing liquid L1 is conveyed from the first processing unit 4 to the second processing unit 5, the processing liquid L1 is less likely to spill out of the substrate W2.

The substrate W2 carried into the second processing unit 5 is held on the substrate placing unit 52 by the substrate holding member 53.

Step (B) is performed on the substrate W2 held on the substrate placing unit 52. In step (B), while the hard mask film 93 is covered with the film of the processing liquid L1, the substrate W2 is heated by the substrate heating unit 54 at a predetermined temperature that is equal to or higher than the boiling point of the solvent in the processing liquid L1 and is lower than the boiling point of the removing agent so as to promote evaporation of the solvent in the processing liquid L1 on the substrate W2 and reaction of the hard mask film 93 with the removing agent. The reaction of the hard mask film 93 with the removing agent is promoted by the heating. Further, once the solvent in the processing liquid L1 on the substrate W2 is evaporated by the heating, the concentration of the removing agent present at the interface of the hard mask film 93 increases and the removing agent easily diffuses into the hard mask film 93, and the reaction of the hard mask film 93 with the removing agent is promoted. By promoting such a reaction, an object to be removed which is the same as the known removing agents may be effectively (e.g., promptly) removed and an object to be removed which is different from the known removing agents may also be removed.

In a case where the processing liquid L1 contains the thickener having a glass transition point that exceeds the boiling point of the solvent in the processing liquid L1 and is equal to or lower than the boiling point of the removing agent or is lower than the boiling point thereof, the predetermined temperature that is equal to or higher than the boiling point of the solvent in the processing liquid L1 and is lower than the boiling point of the removing agent includes (1) a temperature that is equal to or higher than the boiling point of the solvent in the processing liquid L1 and is lower than the glass transition point of the thickener and (2) a temperature that is equal to or higher than the glass transition point of the thickener in the processing liquid L1 and is lower than the boiling point of the removing agent. Temperature (1) is preferable in view of the fact that the rinsing efficiency in step (C) is improved compared to temperature (2). Temperature (2) is preferable in view of the fact that the reactivity of the removing agent is capable of being utilized compared to temperature (1), thereby promoting the reaction of the hard mask film 93 with the removing agent. The substrate heating unit 54 can heat the substrate W2 while changing the heating temperature in a stepwise manner or can heat the substrate W2 while constantly maintaining the heating temperature. The heating time by the substrate heating unit 54 is appropriately adjusted to a time sufficient to promote the evaporation of the solvent in the processing liquid L1 on the substrate W2 and the reaction of the hard mask film 93 with the removing agent. The heating time is typically 60 seconds to 300 seconds, and may be 140 seconds to 160 seconds.

The heating of the substrate W2 is performed while exhausting the atmosphere in the chamber 51 by the exhaust unit 55. The vapor of the solvent present in the atmosphere in the chamber 51 is discharged from the chamber 51 by the exhaust unit 55. Since the vapor of the solvent easily flows upward in the atmosphere in the chamber 51, the exhaust unit 55 formed in the upper portion of the chamber 51 can effectively discharge the vapor of the solvent present in the atmosphere in the chamber 51. This effective discharge is advantageous in preventing re-adhesion of evaporated solvent to the substrate W2. The gas discharged from the chamber 51 is cooled when passing through the cold trap 553, and the solvent included in the gas is liquefied in the cold trap 553, for example, on the inner wall surface of the cold trap 553. Therefore, the concentration of the solvent included in the gas flowing into the vacuum pump 554 is low.

The substrate W3 heated at the second processing unit 5 is conveyed to the third processing unit 6. At this time, the conveying mechanism 222 takes out the substrate W3 from the second processing unit 5 and carries the taken-out substrate W3 into the third processing unit 6.

The substrate W3 carried into the third processing unit 6 is held by the substrate holding unit 62. At this time, the substrate holding unit 62 horizontally holds the substrate W3 on the turntable 622 in a state where the outer edge of the substrate W3 is supported by the chuck 623. The driving unit 624 rotates the substrate W3 held by the substrate holding unit 62 at a predetermined speed. The control unit 3 controls the operation of the driving unit 624 so as to control, for example, the rotation timing and the rotation speed of the substrate W3.

Step (C) is performed on the substrate W3 held on the substrate holding unit 62. In step (C), while the substrate W3 held on the substrate holding unit 62 is rotated at a predetermined speed, the nozzle 631 of the rinsing liquid supplying unit 63 is positioned above the center of the substrate W3, and the rinsing liquid L2 is supplied from the nozzle 631 to the substrate W3. At this time, the control unit 3 controls the operation of the rinsing liquid supplying unit 63 so as to control, for example, the supplying timing, supplying speed, and supplying amount of the rinsing liquid L2. The rinsing liquid L2 supplied to the substrate W3 spreads to the surface of the substrate W3 by the centrifugal force caused by the rotation of the substrate W3. As a result, the hard mask film 93 that has reacted with the removing agent is removed from the substrate W3. The rinsing liquid L2 splashed from the substrate W3 is discharged via the discharge port 651 of the cup 65 and the liquid discharge mechanism 67. Meanwhile, when the substances other than the adhered substance that has reacted with the removing agent (the hard mask film 93 in this exemplary embodiment) such as, for example, the removing agent and the residue of the processing liquid L1 (e.g., the thickener when the processing liquid L1 contains the thickener) remain on the substrate W3, such substances are also removed by the rinsing liquid L2. Meanwhile, the thickener after heating may be, for example, a decomposed product or a denatured product of the thickener. Further, the adhered substance that has reacted with the removing agent (the hard mask film 93 in this exemplary embodiment) may be, for example, a dissolved product, a decomposed product, a denatured product of the adhered substance.

The substrate W4 supplied with the processing liquid L2 by the third processing unit 6 is discharged from the third processing unit 6. At this time, the conveying mechanism 222 takes out the substrate W4 from the third processing unit 6 and places the taken-out substrate W4 in the delivering unit 214. The conveying mechanism 213 takes out the substrate W4 disposed in the delivering unit 214 by the conveying mechanism 222 to accommodate the taken-out substrate W4 in the carrier C of the placing unit 211.

Various modifications may be made to the above-described exemplary embodiment. Hereinafter, modified examples of the above-described exemplary embodiment will be described. Meanwhile, two or more modified examples described below may be combined with each other.

In the above-described exemplary embodiment, the substrate W2 supplied with the processing liquid L1 is conveyed from the first processing unit 4 to the second processing unit 5, and is then heated at the second processing unit 5. However, the substrate W2 supplied with the processing liquid L1 may not be conveyed from the first processing unit 4 to the second processing unit 5 and may be heated at the first processing unit 4. In that case, the processing station 22 does not need to include the second processing unit 5 and may be configured by the first processing unit 4 and the third processing unit 6. When the substrate W2 supplied with the processing liquid L1 is heated at the first processing unit 4, steps (A) and (B) are performed in a state of holding the substrate on the substrate holding unit 42. When the substrate W2 supplied with the processing liquid L1 is heated at the first processing unit 4, the first processing unit 4 includes the substrate heating unit. The substrate heating unit of the first processing unit 4 may be installed above the substrate held on the substrate holding unit 42 and installed below the substrate held on the substrate holding unit 42. For example, the substrate heating unit may be built in the turntable 422. The substrate heating unit of the first processing unit 4 may be configured by a heater such as, for example, a resistance heating unit and a lamp heater (e.g., an LED lamp heater).

In this exemplary embodiment, the substrate W3 heated by the second processing unit 5 is conveyed to the third processing unit 6, but when the first processing unit 4 has a function of supplying the rinsing liquid, the substrate W3 heated by the second processing unit 5 may be returned to the first processing unit 4 to perform a rinsing processing. In that case, the processing station 22 does not need to include the third processing unit 6 and may be configured by the first processing unit 4 and the second processing unit 5. When the substrate W3 heated by the second processing unit 5 is rinsed at the first processing unit 4, steps (A) and (C) are performed in a state where the substrate is held on the substrate holding unit 42. When the substrate W3 heated by the second processing unit 5 is rinsed at the first processing unit 4, the first processing unit 4 includes a rinsing liquid supplying unit. The rinsing liquid supplying unit of the first processing unit 4 may be configured in the same manner as the rinsing liquid supplying unit 63 of the third processing unit 6.

In the above-described exemplary embodiment, when the first processing unit 4 has a heating function and a rinsing liquid supplying function, all processings of supplying processing liquid, heating, and rinsing may be performed by the first processing unit 4. In that case, the processing station 22 may be configured only by the first processing unit 4. When the heating processing and the rinsing processing are performed by the first processing unit 4, steps (A) to (C) are performed in a state where the substrate is held on the substrate holding unit 42. When the heating processing and the rinsing processing are performed by the first processing unit 4, the first processing unit 4 includes the substrate heating unit and the rinsing liquid supplying unit. The substrate heating unit and the rinsing liquid supplying unit of the first processing unit 4 may be configured in the same manner as described above.

In this exemplary embodiment, the dry etching processing described using FIGS. 6A to 6D is performed at a separate apparatus from the substrate processing apparatus 1, and the substrate W1 after the dry etching processing illustrated in FIG. 6D is disposed in the placing unit 211. However, the present disclosure is not limited thereto and may be configured such that at least one of the units included in the processing station 22 has a function of performing a dry etching processing and the conveying mechanism 222 carries the substrate W1 from the unit directly into the first processing unit 4.

EXAMPLE

A mixture of tetramethylammonium hydroxide (TMAH) and water was deposited on the carbon hard mask film formed on the silicon wafer. Meanwhile, the mixing ratio of TMAH to water was set to 1:50 (weight ratio). After deposition of the liquid, the silicon wafer was heated at 110° C. for 15 seconds, 30 seconds, or 60 seconds. After heating and then washing with water, the carbon hard mask film could be peeled off in any heating time. Meanwhile, after deposition of the liquid, the silicon wafer was allowed to stand at room temperature for 1 minute, 10 minutes, or 100 minutes. After leaving the silicon wafer and washing with water, the carbon hard mask film could not be peeled off even for any standing time.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method for removing an adhered substance from a substrate, the substrate processing method comprising:
supplying a processing liquid that contains a removing agent of the adhered substance and a solvent having a boiling point lower than a boiling point of the removing agent to the substrate;
heating the substrate at a predetermined temperature that is equal to or higher than the boiling point of the solvent and is lower than the boiling point of the removing agent to evaporate the solvent and react the adhered substance with the removing agent; and
supplying a rinsing liquid to the substrate so as to remove the adhered substance from the substrate.

2. The substrate processing method of claim 1, wherein the processing liquid further contains a thickener.

3. The substrate processing method of claim 1, wherein the adhered substance is a hard mask film for etching.

4. The substrate processing method of claim 1, further comprising forming a film of the processing liquid to cover the adhered substance on the substrate, and in the heating of the substrate, the substrate is heated while the adhered substance is covered by the film of the processing liquid.

5. The substrate processing method of claim 2, wherein the thickener has a glass transition point that exceeds the boiling point of the solvent and is equal to or lower than the boiling point of the removing agent.

6. The substrate processing method of claim 2, wherein the thickener has a glass transition point equal to or higher than the boiling point of the removing agent.

7. The substrate processing method of claim 5, wherein the predetermined temperature is equal to or higher than the boiling point of the solvent and is lower than the glass transition point of the thickener.

8. The substrate processing method of claim 5, wherein the predetermined temperature is equal to or higher than the glass transition point of the thickener and is lower than the boiling point of the removing agent.

* * * * *